United States Patent [19]

Citta

[11] 4,091,410
[45] May 23, 1978

[54] FREQUENCY AND PHASE LOCK LOOP SYNCHRONOUS DETECTING SYSTEM HAVING A PAIR OF PHASE LOCK CONDITIONS

[75] Inventor: Richard W. Citta, Oak Park, Ill.

[73] Assignee: Zenith Radio Corporation, Glenview, Ill.

[21] Appl. No.: 739,672

[22] Filed: Nov. 8, 1976

[51] Int. Cl.² .............................................. H04N 9/50
[52] U.S. Cl. ..................................... 358/24; 325/346; 325/421; 325/487; 329/50
[58] Field of Search ................ 325/346, 349, 419-421, 325/423, 487, 60, 329; 329/50, 122-124; 358/158, 23, 24; 331/17, 20, 23, 25

[56] References Cited

U.S. PATENT DOCUMENTS

| | | | |
|---|---|---|---|
| 3,289,082 | 11/1966 | Shumate | 325/60 |
| 3,761,606 | 9/1973 | Hori | 358/25 |
| 3,768,030 | 10/1973 | Brown et al. | 325/423 |
| 3,794,754 | 2/1974 | Haferl | 358/24 |
| 3,808,541 | 4/1974 | Baker et al. | 325/423 |
| 3,826,990 | 7/1974 | Pera | 329/50 |
| 3,883,806 | 5/1975 | Delong et al. | 329/124 |
| 3,984,778 | 10/1976 | Bhopalz | 325/329 |
| 4,039,749 | 8/1977 | Gordy et al. | 325/320 |

Primary Examiner—John C. Martin
Assistant Examiner—Jin F. Ng
Attorney, Agent, or Firm—Nicholas A. Camasto; Roy A. Ekstrand

[57] ABSTRACT

A synchronous detecting system includes an automatic phase and frequency control system having a pair of multipliers coupled to a television tuner. A detector oscillator is also coupled to each of the multipliers. Means are provided to phase shift the oscillator signal at one multiplier such that quadrature beat signals are produced. The output of one of the multipliers is coupled directly to a third multiplier while the output of the other is coupled to a low pass filter. The filtered signal is amplitude limited and applied to the third multiplier and produces an information control signal. In two of the described embodiments, a second low pass filter couples the output of the third multiplier to the frequency control input of a voltage controlled detector oscillator. Two other embodiments are disclosed in which the tuner oscillator is controlled while the detector oscillator is maintained constant. The frequency and phase control system has two equal probability stable phase lock conditions. An inverter selectively operable responsive to the limiter information control assures the correct polarity of recovered information.

9 Claims, 4 Drawing Figures

4,091,410

FREQUENCY AND PHASE LOCK LOOP SYNCHRONOUS DETECTING SYSTEM HAVING A PAIR OF PHASE LOCK CONDITIONS

BACKGROUND OF THE INVENTION

This invention relates generally to synchronous detectors and in particular to those using a local oscillator source of carrier injection. In addition, this invention is related to copending application Ser. No. 727,095, filed Sept. 27, 1976, now patent No. 4,072,909, assigned to the assignee of the present invention which is hereby incorporated by reference.

Synchronous detectors typically comprise multipliers or gated type demodulators to recover amplitude modulated information from a received carrier signal. They differ from the more common envelope type amplitude modulation detectors in their requirement of a source of injection signal maintained in proper phase and frequency synchronism with the amplitude modulated carrier. While offering substantial performance advantages over the less complex and cheaper envelope detectors, synchronous detectors are, in some respects, more difficult to utilize effectively. For example, the phase and frequency synchronization requirements for proper synchronous demodulation applicable in most environments impose exacting performance criteria upon the systems used to supply the proper injection signal.

Recently, television demodulation systems incorporating synchronous detection have been developed in increasing number. Basically, a television demodulation system includes a tuner used to frequency convert a selected one of a plurality of available frequency-spaced station carriers to a common intermediate frequency (IF) signal. Precise bandwidth amplifiers amplify the IF signal to a power level sufficient for demodulation. A synchronous detector oscillator supplies an IF carrier-like signal to the demodulator. The most common synchronous detecting system used in television receivers also includes a closed-loop control system operative upon the detector oscillator to provide synchronism between the locally generated "carrier" and the IF signal. In other, less common, television systems, the synchronous detector oscillator is maintained at a constant frequency and a control system is operative on the tuner oscillator causing the frequency conversion system to alter the IF signal to conform to any changes in the detector oscillator signal. Systems using a closed loop operative upon the detector oscillator "follow" the intermediate frequency signal and thus follow tuner adjustment while those operative upon the tuner do not. The selection is largely one of design choice. In either case, the narrow range of frequency and phase error between the IF and carrier injection signals tolerated by such synchronous detectors limits the operation of the system to the performance range of the control loop.

Recently discovered frequency and phase lock loops, such as those set forth in the above-mentioned referent application, provide improved wide range frequency and phase control loop performance, thus opening the way for greater synchronous detector flexibility. However, such systems are characterized by two equal-probability phase synchronization conditions which, when used in an environment such as a television demodulation system, may recover the modulation components at either of two opposite polarities which is of course undesirable.

Accordingly, it is an object of the present invention to provide an improved synchronous demodulation system. It is a more particular object of the present invention to provide an improved synchronous demodulation system suitable for use in a television receiver environment.

SUMMARY OF THE INVENTION

Demodulation means, having a detector oscillator and synchronous detecting means cooperating to recover information modulated upon a received carrier comprise phase and frequency control means, maintaining a predetermined phase and frequency relationship between the detector oscillator signal and the modulated carrier. The control means and characterized by first and second stable substantially constant-phase synchronization conditions, tending to result in first and second polarities of recovered information, respectively. Switch means responsive to an information control signal from the phase and frequency control means assure the first polarity of recovered information despite occurence of either stable constant-phase conditions.

BRIEF DESCRIPTION OF THE DRAWINGS

The features of the present invention which are believed to be novel are set forth with particularity in the appended claims. The invention, together with further objects and advantages thereof, may best be understood by reference to the following description in conjunction with the accompanying drawings, in the several figures of which like reference numerals identify like elements, and in which:

DESCRIPTION OF THE PREFERRED EMBODIMENT

Figure 1:
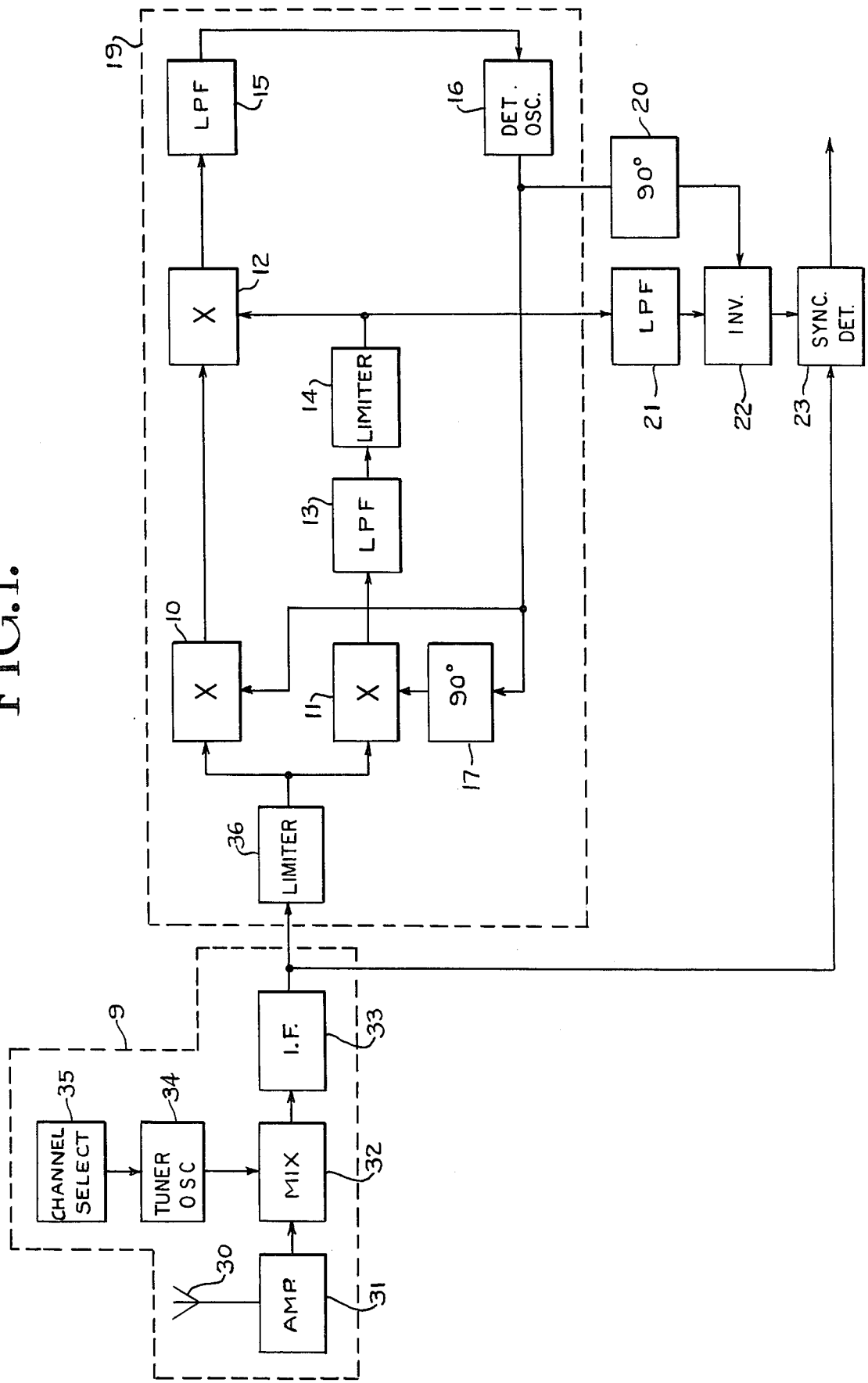
FIG. 1 is a block diagram representation of a television receiver demodulation system constructed in accordance with the present invention using a short loop synchronizing system.

FIG. 1 shows a television demodulation system constructed in accordance with the present invention. A receiving antenna 30 is coupled to an amplifier 31 which, in turn, is coupled to a mixer 32. A channel select means 35 is coupled to a tuner oscillator 34 which is coupled to a mixer 32. The output of mixer 32 is coupled to an intermediate frequency amplifier 33, the output of which is coupled to a limiter 36 and one input of a synchronous detector 23. Limiter 36 is coupled to a pair of multipliers 10 and 11. The former is coupled directly to one input of a multiplier 12 while the latter is coupled to a serial combination of a low pass filter 13 and a limiter 14.

Limiter 14 produces an information control signal which is coupled to one input of multiplier 12 and to a selectively operable inverter 22 via a low pass filter 21.

The output of multiplier 12 constitutes a loop control signal and is applied to a voltage controlled detector oscillator 16 via a low pass filter 15. Detector oscillator 16 is coupled directly to one input of multiplier 10 and to one input of multiplier 11 via a 90° phase shift network 17. Detector oscillator 16 is also coupled to inverter 22 via a phase shift network 20. Synchronous detector 23 should be understood to be coupled to the appropriate signal processing portions of a television receiver (not shown).

In operation, an amplitude modulated radio frequency carrier signal received by antenna 30 is amplified by amplifier 31 to a sufficient power level for processing by mixer 32. Channel select means 35 (typically actuated by the viewer) adjust the frequency of signal supplied by tuner oscillator 34. By operation of the familiar heterodyning process within mixer 32, the received radio frequency carrier signal is converted to an intermediate frequency (IF) amplitude modulated carrier. The IF signal is further amplified by frequency selective amplifier stages within IF amplifier 33 and is applied jointly to limiter 36 and one input of synchronous detector 23. The former is constructed to produce amplitude limiting of the IF signal at a level such that its output (coupled to quadrature multipliers 10 and 11) is substantially free of amplitude variation.

A general understanding of the present invention is best obtained by ignoring for the moment the synchronization operations within frequency and phase lock loop 19 (which will be described in detail below) and considering oscillator 16 to be simply a source of injection signal which is synchronized in phase and frequency with the IF carrier. This injection signal is free of amplitude variation and when coupled to synchronous detector 23, together with the amplitude modulated IF signal, enables conventional multiplier circuitry within detector 23 to recover the modulation components. In accordance with well-known practice, the output of detector oscillator 16 is phase shifted 90° before injection to detector 23 to accommodate the "cosine" detection properties inherent in such multipliers.

The recovered modulation components comprise the well-known composite video signal typical of television synchronous detectors which includes luminance, chrominance, display synchronization, and sound information. However, unlike prior art demodulation systems which exhibit a single polarity of recovered signal, the output of synchronous detector 23 may have either of two opposite polarities. This is due to the existence of two equal probability constant-phase conditions attainable by frequency and phase lock loop 19 which cause phase synchronization of detector oscillator 16 in either a 90° or 270° relationship with the intermediate frequency carrier. If coupled without further processing to synchronous detector 23, this bi-phase oscillator injection would result in either of two polarities of recovered information. This is undesirable in a television receiver environment in which only one signal polarity may be effectively processed.

The alleviation of this problem is best understood if the synchronization operation of loop 19 is described in greater detail by initially assuming an out-of-sync condition and describing the loop acquisition process. Because the output signal of detector oscillator 16 is applied directly to multiplier 10 while that applied to multiplier 11 is shifted 90° by network 17, multipliers 10 and 11, in response to the input signal and quadrature samples of the output of detector oscillator 16, produce a pair of quadrature phase "beat" or difference signals together with "sum" signals. The latter are removed by filters 13 and 15. While these quadrature beat signals are obtained by inducing a phase shift in an oscillator input it should be obvious that any combination of phase shift networks in either or both the detector oscillation and IF signal inputs may be used to produce quadrature beat signals without departing from the spirit of the present invention. The beat signal output of multiplier 10 is directly coupled to one input of multiplier 12 while the quadrature beat signal from multiplier 11 is converted by limiter circuit 14 and low pass filter 13 to a constant amplitude information control signal before application to multiplier 12.

Because low pass filter 13 has a predetermined phase versus frequency characteristic, the phase delay which occurs within filter 13 (and therefore the phase of the information control signal from limiter 14) is a function of the beat signal frequency. Multiplication of the "squared" output signal of limiter 14 and the sinusoidal beat signal output of multiplier 10 produces an error signal of constant amplitude having a D.C. component which varies with beat signal frequency. This D.C. component is coupled by filter 15 to detector oscillator 16 facilitating frequency acquisition.

Once frequency acquisition is complete, that is, the frequencies of detector oscillator 16 and the input signal are substantially equal, frequency lock has occurred and the frequency difference detecting portion of the system ceases to contribute to the error voltage. Because the loop control signal output of multiplier 12 is not diminished as frequency lock is approached but rather becomes a very low frequency signal having a near zero D.C. average, the phase lock function of frequency and phase lock loop 19 is facilitated. Due to the close frequencies of the input and detector oscillator signals (i.e. small static frequency error), the beat signal is of low enough frequency to pass through filter 15 substantially unaltered causing modulation of the detector oscillator's frequency. The extent of frequency "swing" thus caused will affect phase lock in either of two ways.

The first, and most desirable, occurs if the static frequency error of the system, that is, the in-sync frequency difference between the IF and oscillator signals, is less than the beat note caused oscillator frequency excursions. In this case, phase lock is obtained the instant the oscillator frequency exactly coincides with the input signal. The second type of phase lock occurs if the static frequency error exceeds the oscillator frequency excursions by the familiar asymmetrical beat note formation process well-known in automatic phase lock systems as "pull-in".

In either type of phase lock operation the output signals of multipliers 10 and 11 become D.C. voltages proportional to the phase differences between their respective input signals. Since the signals applied to multiplier 10 are substantially in quadrature, a near zero D.C. output signal results while the in-phase inputs of multiplier 11 (due to the action of phase shifter 17) cause either a maximum positive or negative output voltage depending upon which stable state has been attained. Correspondingly, the output of multiplier 11 passed by low pass filter 13 causes limiter 14 to apply either a positive or zero voltage to one input of multiplier 12. Simply stated, the actions of multiplier 11, low pass filter 13, and limiter 14 produce no effect upon the error signal developed by multiplier 10 once acquisition of either stable phase lock condition (evidenced by D.C. output signals from multipliers 10 and 11) is obtained. Multiplier 10, low pass filter 15, and detector oscillator 16 perform the standard automatic phase control functions to maintain phase synchronization.

As mentioned, the information control signal output of limiter 14 is essentially binary, that is, characterized by either of two voltage states, causing the present invention system to exhibit two equal probability stable phase lock states. The first is the same as that typically exhibited by prior art phase lock systems when the input and oscillator signals are in quadrature. The second arises when the output of limiter 14 "switches" and corresponds to a 270° phase relationship between input and oscillator signals.

Once phase and frequency synchronization is obtained, the information control signal output of limiter 14 is at either of two voltage states corresponding to the 90° and 270° phase synchronization conditions providing a phase indicative signal which is coupled by low pass filter 21 to one input of inverter 22. Selective inverter 22 includes well-known multiplier circuitry which when driven by the output signal of detector oscillator 16 and the "binary" voltage information control signal limiter 14 provides phase inversion of the coupled oscillator signal in response to one binary state and direct coupling thereof in response to the other binary state. The "selective" inversion maintains the correct injection signal phase for synchronous detector 23 in either stable phase lock condition.

In short, the output signal of limiter 14 comprises a phase indication signal which is utilized by inverter 22 to selectively invert the oscillator signal during that phase lock condition which would otherwise result in the undesired polarity of recovered information and couple it unaltered during the phase lock condition which produces the desired polarity of recovered information.

The embodiment shown in FIG. 1 is often referred to as a "short loop" system because the frequency and phase lock loop is responsive to changes of intermediate frequency signal and maintains synchronization by conforming the voltage controlled detector oscillator within the loop to those changes. This important characteristic of such short loop systems when utilized in a television synchronous demodulator system provides the facility to accommodate preferential or erroneous alteration of the intermediate frequency signal. As the intermediate frequency signal varies, the system follows or tracks the changes, thus maintaining proper information recovery.

Figure 2:
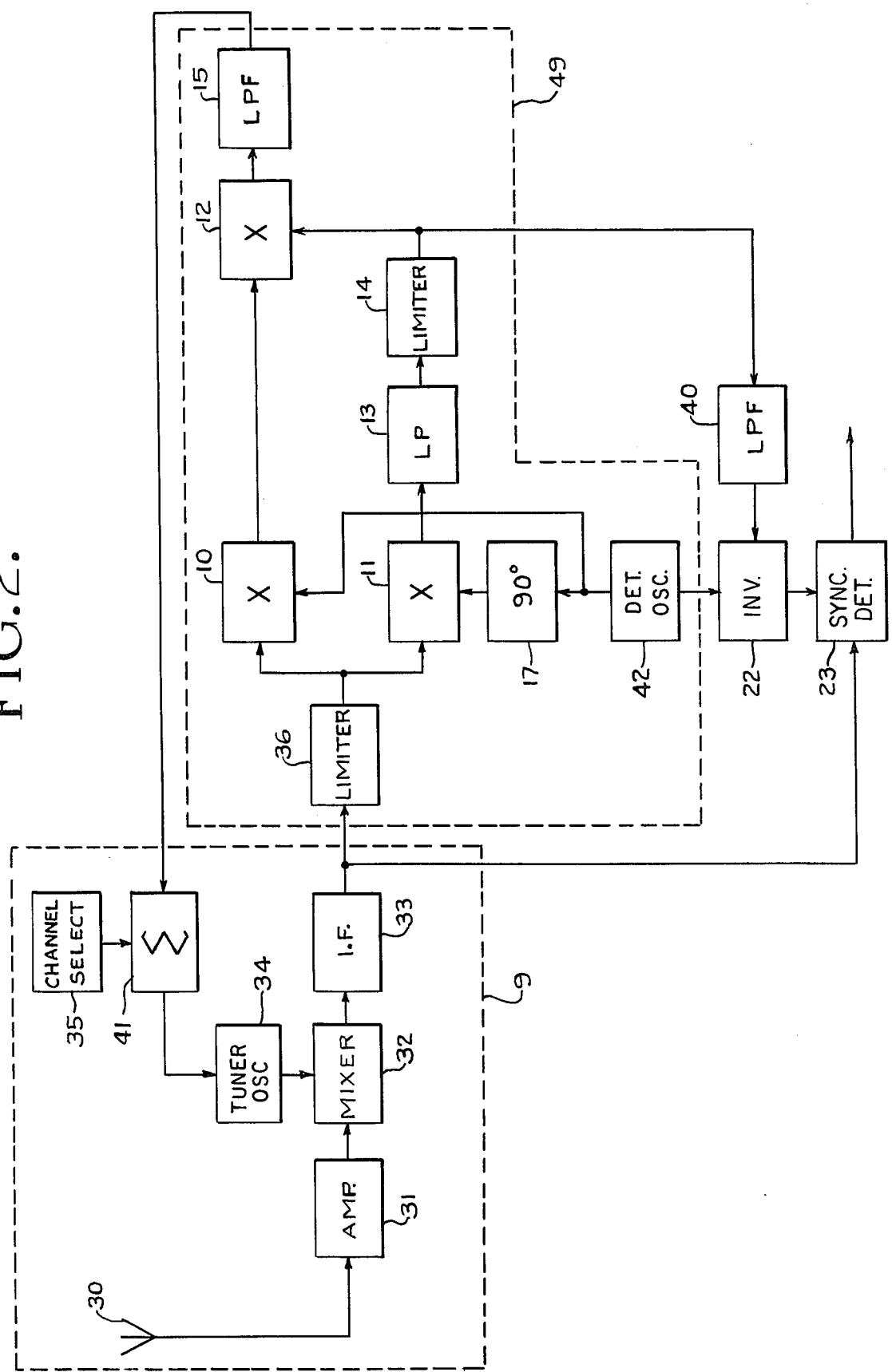
FIG. 2 is a block diagram representation of a television receiver demodulation system constructed in accordance with the present invention using a long loop synchronizing system.

FIG. 2 shows a television demodulation system similar to that shown in FIG. 1 which embodies a so-called "long loop" system. Comparison of FIGS. 1 and 2 shows a difference in the synchronization of the detector oscillator and IF carrier. In the long loop system (FIG. 2) the detector oscillator is maintained at a fixed frequency and frequency and phase control system 49 operates upon the tuner oscillator to provide proper frequency and phase synchronization. In other words, short loop systems utilize control loops which cause the synchronous detector oscillator to "follow" changes in the intermediate frequency signal while long loop systems use control loops operative upon the frequency converter within the tuner causing the intermediate frequency signal to "follow" the synchronous detector oscillator.

As would be expected, the construction of a long loop system is, in most respects, similar to that of a short loop. Specifically, the long loop system of FIG. 2 includes a receiving antenna 30 coupled to an RF amplifier 31 which drives a mixer 32. Channel select means 35 are coupled to tuner oscillator 34 by a summing network 41. The output of tuner oscillator 34 is applied to mixer 32, the output of which is coupled via an intermediate frequency amplifier 33 to a limiter 36 and a synchronous detector 23. Limiter 36 is coupled to a pair of multipliers 10 and 11, the outputs of which are coupled to a multiplier 12 and a low pass filter 13 respectively. The output of filter 13 is coupled via a limiter 14 to multiplier 12 and to an inverter 22 via a low pass filter 40. A detector oscillator 42 is coupled directly to inverter 22 and multiplier 10 as well as to multiplier 11 via a phase shift network 17. The output of inverter 22 is coupled to synchronous detector 23, the output of which should be understood to be applied to conventional television processing circuitry (not shown). The output of multiplier 12 is coupled to summing network 41 by a low pass filter 15 and constitutes the loop control signal.

In operation, antenna 30, amplifier 31, mixer 32, tuner oscillator 34 and IF amplifier 33, all within tuning means 9, each perform the same function as that described in FIG. 1. A received modulated carrier from antenna 30 is applied via amplifier 31 to mixer 32 which responds to tuner oscillator 34 to frequency convert the received signal to an information modulated intermediate frequency carrier. This signal is coupled via IF amplifier 33 to limiter 36 which removes the amplitude variations and directly drives quadrature multipliers 10 and 11.

Multipliers 10 and 11 together with low pass filter 13 and limiter 14 provide a pair of quadrature beat note signals (similar to those described in the foregoing descriptions of the short loop system of FIG. 1) which are applied to multiplier 12. Also inverter 22 is interposed between detector oscillator 42 and the synchronous detector to selectively invert or directly couple the oscillator signal applied to detector 23 in response to the information control signal output of limiter 14 in a similar manner to the systems in FIG. 1.

Unlike the short loop system shown in FIG. 1, however, the long loop system of FIG. 2 includes a fixed frequency oscillator 42 maintained at a constant frequency detector and phase rather than a VCO. Correspondingly, the output of multiplier 12 (e.g. the frequency and phase control signal referred to simply as the loop control signal) is coupled via low pass filter 15 to summing network 41 where it is combined with the output of channel select means 35 to control tuner oscillator 34 rather than to the synchronous detector oscillator. Phase and frequency acquisition is accomplished in the long loop system of FIG. 2 in a similar manner to the short loop system of FIG. 1 with the exception that the loop control signal is operative upon the tuner oscillator 34 to maintain the intermediate frequency signal in phase and frequency synchronization with the signal provided by fixed frequency detector oscillator 42.

As mentioned, the television receiver processing circuitry generally tolerates only one phase or polarity of recovered modulation components. For this reason, inverter 22 responds to the information control signal output of limiter 14 and maintains the proper polarity of synchronous detector output in either stable phase lock condition of frequency and phase lock loop 49.

Unlike the short loop system shown in FIG. 1, the long loop system of FIG. 2 achieves an "exact" tuning mode in which the frequency of the IF carrier is adjusted to compensate for station errors.

Figure 3:
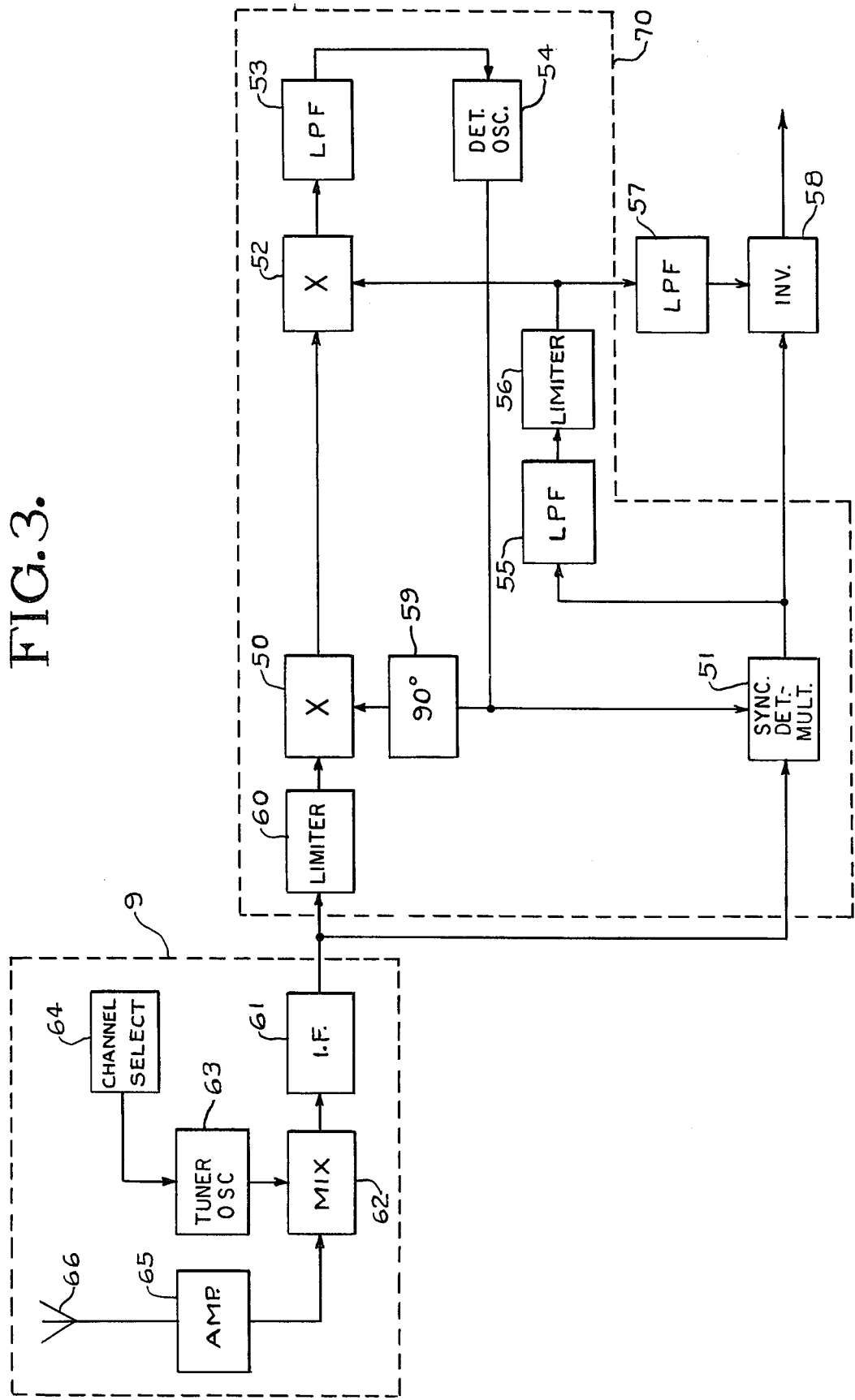
FIG. 3 is a block diagram representation of an alternative television receiver demodulation system constructed in accordance with the present invention using a short loop synchronizing system.

FIG. 3 shows another short loop demodulating system for a television receiver constructed in accordance with the present invention in which a receiving antenna 66 is coupled to an amplifier 65, which in turn is coupled to a mixer 62. Channel select means 64 are coupled to a tuner oscillator 63, the output of which is coupled to mixer 62. The output of mixer 62 is coupled by an IF amplifier 61 to a limiter 60 and a synchronous detecting multiplier 51. A voltage controlled oscillator 54 is coupled directly to synchronous detecting multiplier 51 and via a 90° phase shift network 59 to a multiplier 50. The output of limiter 60 is coupled to multiplier 50, the output of which is coupled directly to a multiplier 52.

A serial combination of a low pass filter 55 and a limiter 56 couples the output of synchronous detecting multiplier 51 directly to multiplier 52 and to an inverter 58 via a low pass filter 57. Multiplier 52 is coupled to voltage controlled detector oscillator 54 by a low pass filter 53 while the output of synchronous detector multiplier 51 is coupled to inverter 58. Inverter 58 should be understood to be coupled to conventional television processing circuitry (not shown).

In general, the operation of the demodulating system shown in FIG. 3 is substantially the same as that set forth in FIG. 1 with the exception that synchronous detecting multiplier 51 performs the dual functions of providing a quadrature beat note signal for use in frequency and phase control as well as the recovery of information amplitude modulated upon the intermediate frequency carrier removing the need for an additional synchronous detector multiplier. The system shown in FIG. 3 also differs from that described in FIG. 1 in that the oscillator injection to the synchronous detector multiplier is directly coupled in both equal probability phase lock conditions. The desired polarity of recovered modulation components is maintained instead by inversion of the output of synchronous detector multiplier 51. The phase indicative binary voltage information control signal from limiter 56 is applied to an inverter 58 which in response to the phase lock conditions of the control loop selectively inverts or directly couples the recovered information to the receiver processing circuitry.

More specifically, multiplier 50 and synchronous detector multiplier 51 are driven by quadrature signals derived from voltage controlled detector oscillator 54 and produce quadrature beat note signals. Because multiplier 50 is driven by the output signal of limiter 60 which has removed amplitude variations from the IF signal, the output of multiplier 50 is substantially free of amplitude varying components in its beat note signal. In contrast, synchronous detector multiplier 51 is driven directly by the amplitude modulated intermediate frequency carrier and as a result, produces both a beat note signal in quadrature with that of multiplier 50 and recovered amplitude modulation components. When detector oscillator 54 and the intermediate frequency signal are not synchronized, frequency and phase lock loop 70 is in the process of accomplishing synchronization, the output beat note signal from synchronous detector multiplier 51 is processed by low pass filter 55 and limiter 56 in a similar manner to previously described systems to produce a constant-amplitude variable-phase beat signal which together with the beat signal produced by multiplier 50 are applied to multiplier 52 producing an appropriate frequency and phase control signal. Detector oscillator 54 responds to this control signal and is synchronized to the IF signal.

Once the system has attained frequency and phase synchronization, the beat note signal from synchronous detector multiplier 51 becomes a D.C. voltage. However, the multiplication of the output of voltage controlled detector oscillator 54 and the intermediate frequency signal produces conventional synchronous detection and recovery of the amplitude modulated information components. Because the information control signal output of limiter 56 is "binary", these components do not affect its output and will therefore not upset synchronization.

As mentioned, inverter 58 is interposed between the output of synchronous detecting multiplier 51 and the conventional television processing circuitry. In response to the binary information control signal output of limiter 56 (which indicates the "lock state" attained by frequency and phase lock loop 70) inverter 58 selectively inverts or directly couples the recovered information.

The short loop system shown in FIG. 3 achieves a considerable saving of components over the short loop system shown in FIG. 1. It should be noted, however, and will be apparent to those skilled in the art, that the dual use of synchronous detecting multiplier 51 is not without difficulty. For example, the system in FIG. 3 requires selective inversion of the recovered modulation components which typically include a wide range of signal frequencies. As a result, inverter 58 will generally be more complex than inverter 22 which simply inverts a single frequency oscillator injection signal in response to the equal probability phase lock conditions of the loop. In either case, both systems (FIG. 1 and FIG. 3) are short loop configurations which accommodate preferential or other "erroneous" tuning changes of the intermediate frequency signal and maintain synchronization by causing the synchronous detector oscillator to track or follow the intermediate frequency signal.

Figure 4:
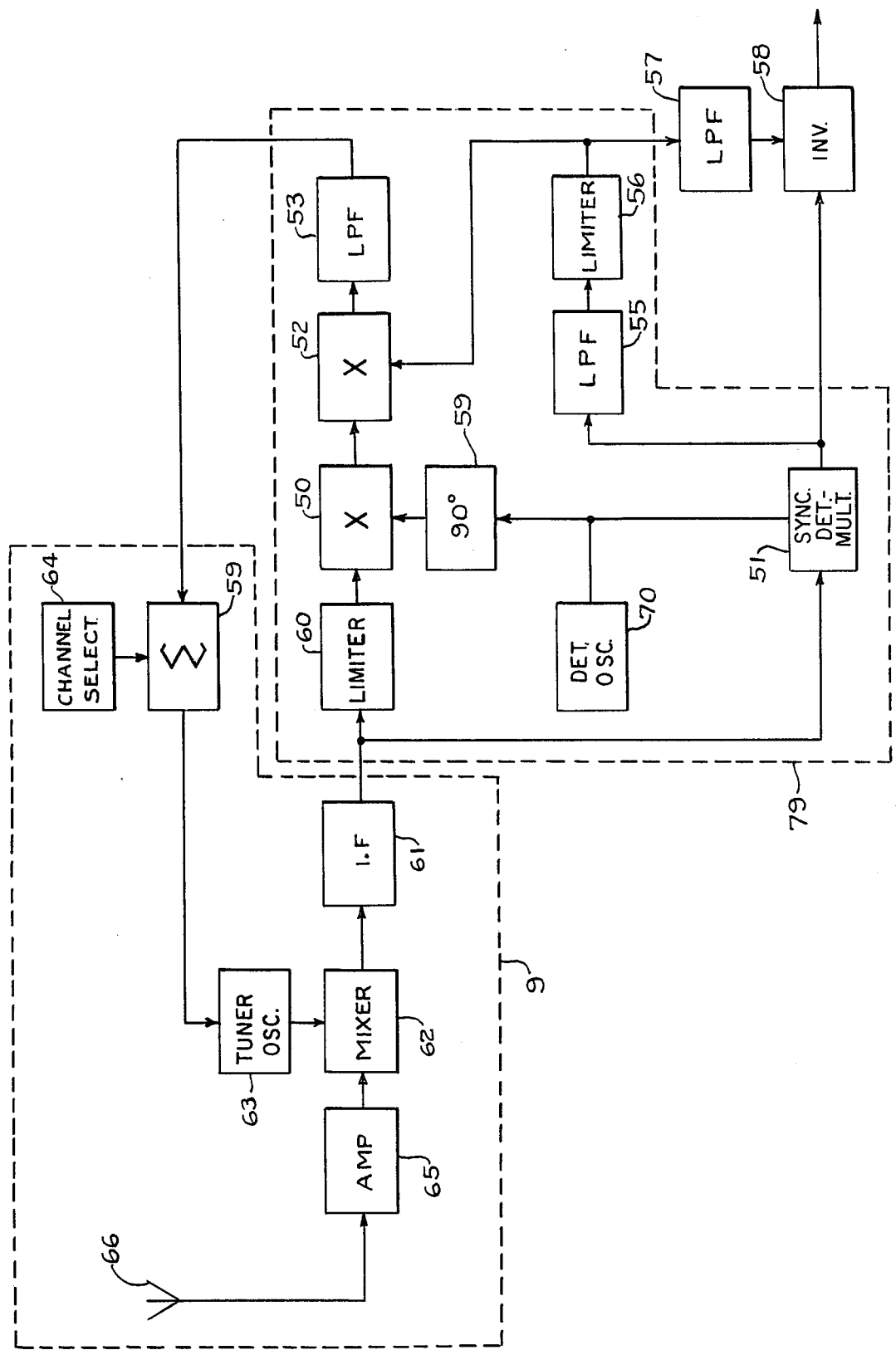
FIG. 4 is a block diagram representation of an alternative television receiver demodulation system constructed in accordance with the present invention using a long loop synchronizing system.

FIG. 4 shows a long loop television demodulating system constructed in accordance with the present invention having a dual function synchronous detector multiplier similar to that shown in FIG. 3. A receiving antenna 66 is coupled to an RF amplifier 65, the output of which is coupled to a mixer 62. A tuner oscillator 63 is connected to mixer 62, the output of which is coupled via an intermediate frequency amplifier 61 to a limiter 60 and a synchronous detector multiplier 51. Limiter 60 is coupled to a multiplier 50 which is coupled to a multiplier 52. A fixed frequency detector reference oscillator 70 is coupled directly to synchronous detector multiplier 51 and to multiplier 50 via a 90° phase shift network 59. The output of multiplier 51 is coupled by a serial combination of a low pass filter 55 and a limiter 56 to multiplier 52 and to low pass filter 57. The outputs of synchronous detector multiplier 51 and low pass filter 57 are coupled to an inverter 58, the output of which should be understood to be coupled to conventional television receiver processing circuitry (not shown). The output of multiplier 52 is coupled via a low pass filter 53 to a summing network 59. Channel select means 64 are also coupled to summing network 59, the output of which is coupled to tuner oscillator 63.

The operation of the system shown in FIG. 4 is substantially the same as that shown in FIG. 3 with the exception of the differences between short loop and long loop systems. That is, the loop control signal produced by multiplier 52 is coupled via summing network 59 to tuner oscillator 63, while synchronous detector oscillator 70 is maintained at a fixed frequency. Control loop 79 is operative upon tuner oscillator 63 altering the frequency conversion within the tuner to conform the intermediate frequency signal to changes in detector oscillator 70 thereby providing phase and frequency synchronization. As described in conjunction with the system shown in FIG. 3, synchronous detector multiplier 51 performs the dual functions of a quadrature beat note multiplier and a synchronous detector. Correspondingly, inverter 58 performs selective inversion or direct coupling of the recovered modulation components in response to the binary information control signal produced by limiter 56.

In all of the embodiments shown, the utilization of inverting means selectively operative in response to the equal-probability phase lock conditions of extended range frequency and phase control loops maintain the desired polarity of recovered modulation components notwithstanding the bi-phase performance of the control loops. The result is an improved synchronous demodulating system suitable for use in a television receiver or similar environment where the polarity of recovered signal is to be maintained constant.

While particular embodiments of the invention have been shown and described, it will be obvious to those skilled in the art that changes and modifications may be made without departing from the invention in its broader aspects, and, therefore, the aim in the appended claims is to cover all such changes and modifications as fall within the true spirit and scope of the invention.

What is claimed is:

1. Demodulation means, having a detector oscillator and synchronous detecting means cooperating to recover information modulated upon a received carrier, comprising:
   phase and frequency control means for maintaining a predetermined phase and frequency relationship between the detector oscillator signal and the modulated carrier, said control means being characterized by first and second stable subtantially constant-phase synchronization conditions, tending to result in first and second polarities of recovered information, respectively and
   switch means, responsive to an information control signal from said phase and frequency control means, for assuring said first polarity of recovered information despite occurrence of either of said stable constant-phase conditions.

2. Demodulation means as set forth in claim 1 wherein said phase and frequency control means include:
   generating means producing first and second quadrature beat signals between said detector oscillator signal and said modulated carrier
   translating means producing said information control signal by converting said first beat signal to a constant amplitude signal having a phase which varies in a predetermined relationship to said beat signal frequency; and
   multiplying means multiplying said second beat signal and the output of said translating means to produce a loop control signal.

3. Demodulation means as set forth in claim 2 wherein said translating means include:
   filter means, coupled to said generating means, producing a phase shift in signals coupled therethrough which has a predetermined relationship to beat signal frequency; and
   limiting means, coupled to said filter means and said multiplying means, symmetrically amplitude limiting said first beat signal and producing said information control signal; said information control signal exhibiting a first voltage in said first constant-phase condition and a second voltage in said second constant-phase condition.

4. Demodulation means as set forth in claim 3 wherein said detector oscillator is voltage controllable and wherein said loop control signal is coupled to said detector oscillator for controlling its phase and frequency.

5. Demodulation means as set forth in claim 4 wherein said synchronous detecting means include a synchronous detector supplied with said received carrier and coupled to said detector oscillator and wherein said switch means include inverting means, responsive to said information control signal, interposed between said detector oscillator and said synchronous detector, inverting said detector oscillator signal during said second constant-phase condition.

6. Demodulation means as set forth in claim 4 wherein said synchronous detecting means include a synchronous detector-multiplier supplied with said received carrier and coupled to said detector oscillator, and wherein said switch means include inverting means, responsive to said information control signal coupled to said synchronous detector-multiplier inverting said recovered information during said second constant-phase condition.

7. Demodulation means as set forth in claim 3 further including tuning means having a tuner oscillator and a mixer and wherein said received carrier is an intermediate frequency carrier derived from said tuner oscillator and mixer;
   means coupling said loop control signal to said tuning means for controlling the frequency and phase of said intermediate frequency carrier; and
   wherein said generating means include a detector oscillator of substantially constant frequency and phase.

8. Demodulation means as set forth in claim 7 wherein said synchronous detecting means include a synchronous detector coupled to said tuning means and said detector oscillator and wherein said switch means includes inverting means, responsive to said information control signal interposed between said detector oscillator and said synchronous detector, inverting said detector oscillator signal during said second constant-phase condition.

9. Demodulation means as set forth in claim 7 wherein said synchronous detecting means include a synchronous detector-multiplier coupled to said tuning means and said detector oscillator, and wherein said switch means include inverting means, responsive to said information control signal, coupled to said synchronous detector-multiplier, inverting said recovered information during said second constant-phase condition.

* * * * *